US 6,740,475 B2

(12) United States Patent
Richter et al.

(10) Patent No.: US 6,740,475 B2
(45) Date of Patent: May 25, 2004

(54) METHOD FOR STRUCTURING A PHOTORESIST LAYER

(75) Inventors: Ernst-Christian Richter, Erlangen-Bruck (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 74 days.

(21) Appl. No.: 10/134,151

(22) Filed: Apr. 29, 2002

(65) Prior Publication Data

US 2002/0160318 A1 Oct. 31, 2002

(30) Foreign Application Priority Data

Apr. 27, 2001 (DE) ........................................ 101 20 676

(51) Int. Cl.$^7$ ................................................. G03C 5/00
(52) U.S. Cl. ...................... 430/322; 430/311; 430/330; 430/394; 430/270.1; 430/905; 430/910
(58) Field of Search ................................ 430/322, 311, 430/330, 394, 270.1, 905, 910

(56) References Cited

U.S. PATENT DOCUMENTS

| | | | | |
|---|---|---|---|---|
| 4,161,405 A | * | 7/1979 | Crivello | 430/280.1 |
| 5,266,424 A | * | 11/1993 | Fujino et al. | 430/5 |
| 5,565,304 A | * | 10/1996 | Honda | 430/311 |
| 5,650,261 A | * | 7/1997 | Winkle | 430/270.1 |
| 6,017,683 A | * | 1/2000 | Endo et al. | 430/326 |
| 6,096,483 A | * | 8/2000 | Harkness et al. | 430/325 |
| 6,277,546 B1 | * | 8/2001 | Breyta et al. | 430/322 |
| 6,303,268 B1 | * | 10/2001 | Namba et al. | 430/270.1 |
| 6,338,936 B1 | * | 1/2002 | Ichikawa et al. | 430/285.1 |
| 6,436,593 B1 | * | 8/2002 | Minegishi et al. | 430/18 |
| 6,479,209 B1 | * | 11/2002 | Aoai et al. | 430/270.1 |
| 6,514,663 B1 | * | 2/2003 | Hien et al. | 430/270.1 |
| 6,517,990 B1 | * | 2/2003 | Choi et al. | 430/270.1 |
| 2001/0050741 A1 | * | 12/2001 | Hokazono et al. | 349/137 |
| 2002/0012867 A1 | | 1/2002 | Yasuda | 430/191 |
| 2002/0045122 A1 | * | 4/2002 | Iwasa et al. | 430/270.1 |

FOREIGN PATENT DOCUMENTS

| | | | | |
|---|---|---|---|---|
| EP | 0 962 825 A1 | 12/1999 | | |
| JP | 08-152717 | * | 11/1996 | G03F/7/038 |

* cited by examiner

*Primary Examiner*—Mark F. Huff
*Assistant Examiner*—Daborah Chacko-Davis
(74) *Attorney, Agent, or Firm*—Laurence A. Greenberg; Werner H. Stemer; Ralph E. Locher

(57) ABSTRACT

A photoresist layer structuring process includes a substrate with a photoresist layer applied thereto in parts. The photoresist layer includes a film-forming polymer having molecular groups convertable into alkali-soluble groups by acid-catalyzed cleavage reactions. The polymer includes a photoacid generator liberating an acid on exposure to light in a wavelength range, and a photobase generator liberating a base on exposure to light in a wavelength range. First, the photoresist layer is exposed to light from the second range, the light wavelength being chosen so that the photoacid generator is substantially inert to the irradiation, and is exposed to light from the first range, the light wavelength being chosen so that the photobase generator is substantially inert to the irradiation. The photoresist layer is then heated to a temperature at which the cleavage reaction catalyzed by the photolytically produced acid takes place, and finally the photoresist layer is developed.

50 Claims, No Drawings

METHOD FOR STRUCTURING A PHOTORESIST LAYER

BACKGROUND OF THE INVENTION

Field of the Invention

The invention relates to a process for structuring a photoresist layer.

In semiconductor technology, photolithographic methods play a key role in the production of integrated circuits on a semiconductor substrate. Typically, photoresist layers are applied to the surface of the substrate to be structured and are then structured by exposure to radiation from a suitable wavelength range. The exposure for structuring is effected by a lithography mask that predetermines the structure that is to be transferred to the substrate. The exposed parts of the photoresist layer are chemically modified by the exposure and their polarity is, thus, changed. For this reason, the exposed and the unexposed parts of the photoresist have different solubilities in a corresponding developer. This is used in the subsequent development step for selectively removing the exposed or unexposed parts. Those parts of the photoresist layer that remain on the substrate serve in the following structuring step as a mask that protects the substrate layer underneath from removal of material or modification of material. Such a structuring step may be, for example, plasma etching, wet chemical etching, or ion implantation.

Both in the case of the one-layer resists developable by a wet method and in the case of the two-layer resist systems developable completely or partly by a dry method, chemical amplification resists (CAR) have proven particularly useful as photoresists. Chemical amplification resists are characterized in that they contain a photoacid generator, i.e., a photosensitive compound that generates a protic acid on exposure to light. The protic acid then initiates acid-catalyzed reactions in the base polymer of the resist, if necessary with thermal treatment of the resist. As a result of the presence of the photoacid generator, the sensitivity of the photoresist is substantially increased compared with a conventional photoresist. An overview of this topic is given by H. Ito in Solid State Technology, July 1996, page 164 et seq.

In the case of the positive resists, the different solubilities of the exposed and of the unexposed photoresist is achieved by the principle of acid-catalyzed cleavage. A polar carboxyl group is formed thereby from a nonpolar chemical group of the layer-forming polymer, for example, a tert-butyl carboxylate group, in the presence of a photolytically produced acid, if necessary in a heating step. Further examples of nonpolar "blocked" groups that can be converted into corresponding polar groups by acid-catalyzed reactions are the tert-butoxycarbonyloxy (t-BOC) or acetal groups. Through the conversion of the nonpolar group into the corresponding polar group, the resist undergoes a change in polarity in the previously exposed parts, with the result that it becomes soluble in the polar, aqueous alkaline developer. Consequently, the developer selectively removes exposed parts of the photoresist. The resist residues in the unexposed, nonpolar parts, thus, geometrically define a resist profile or a resist structure on the substrate, which serves in subsequent process steps as a mask for surface structuring.

In contrast, a reduction in the solubility of the photoresist in the exposed parts is caused by the exposure in negative resists. To achieve such a result, negative-working photoresists have, as a rule, crosslinkable groups that can undergo crosslinking reactions under the influence of irradiation. As a result of the crosslinking, the solubility of the exposed parts of the photoresist in a corresponding developer is reduced. The crosslinkable groups can either be directly bonded to the base polymer or be present as a separate crosslinking component in the photoresist. In chemically amplified, negative-working photoresists, groups that are crosslinkable under acid catalysis and are activated by the photolytically liberated acid are used.

Due to the constantly increasing integration density in semiconductor technology, the accuracy with which the resist profile can be produced after development on a surface to be structured is of decisive importance. The resist profile is firstly physically uniquely predefined by the light distribution during the exposure. Secondly, it is chemically transferred to the resist layer by the distribution of the components produced photochemically by the exposure.

Due to the physicochemical properties of the resist materials, completely unfalsified transfer of the pattern predetermined by the lithography mask to the resist is, however, not definitively possible. Here, in particular, interference effects and light scattering in the photoresist play a major role. However, the steps following the exposure, such as, for example, the development, additionally have a considerable influence on the quality of the resist profiles, which is substantially determined by the profile sidewalls. To achieve surface structuring that is as precise as possible in the subsequent process steps, it would be ideal if it were possible to obtain virtually perpendicular, smooth profile sidewalls in the resist profile after development of the photoresist.

In particular, the light intensity profile that results in the photoresist during the exposure has an adverse effect on the steepness of the profile sidewalls that is to be achieved. This characteristic intensity profile, which is also referred to as "aerial" image, is due to the light scattering and light absorption occurring in the resist during exposure. Because the photoresist absorbs a certain proportion of the incident radiation, the observed radiation intensity decreases with increasing layer thickness in the photoresist. Consequently, those parts of the photoresist layer that are close to the surface are more strongly exposed. In the case of a positive resist, the parts that are close to the surface are, thus, more highly soluble than the parts away from the surface. The different solubilities within an exposed part of the resist often leads to a flattening and to poor definition of the profile sidewalls in the case of positive resists. The light intensity profile in the photoresist thus describes the distribution of a photochemically modified species, for example, the distribution of the photolytically produced acid in the photoresist in the case of a positive resist.

In the case of negative resists, the decrease in the radiation intensity with increasing layer thickness in the photoresist leads to greater crosslinking in the parts that are close to the surface and that, thus, have a lower solubility than the parts away from the surface. In the subsequent development of the exposed photoresist, those parts of the photoresist layer that are away from the surface are, thus, dissolved to a greater extent than the parts on top that are close to the surface, with the result that the quality of the profile sidewalls and, hence, the resolution also deteriorate.

The quality and the steepness of the resist profiles are of decisive importance for the transfer of the structure from the photomask to the layer underneath that is to be structured. One prior art approach for improving the quality of resist profiles in positive resists, is described in European Patent Application EP 962825 A, corresponding to U.S. Pat. No.

2,012,867 A1 to Yasuda. There, an improved steepness of the resist sidewalls is achieved by adding to the photoresist two photochemically active additives that are activated by radiation in different wavelength ranges in each case. Firstly, the photoresist contains a photoacid generator that, as already described above, liberates an acid on exposure to light of a defined wavelength range, which acid then catalyzes the reaction of the convertible nonpolar groups of the layer-forming polymer of the photoresist to give carboxyl groups and, hence, causes the photoresist to be soluble in the polar developer. Secondly, the photoresist contains, as the second photochemical additive, a crosslinking reagent that results in a reduction of the solubility of the photoresist. The crosslinking reagent is likewise activated by radiation, the radiation used for such a purpose differing from the radiation used for activating the photoacid generator.

According to Yasuda, the photoacid generator is activated in the parts determined by the mask layout, in a first exposure step for structuring. In a subsequent, second floodlight exposure step, the total photoresist layer is exposed without the use of a photomask, and the crosslinking reagent is, thus, photochemically activated over the total surface of the photoresist layer. As a result of the chemical crosslinking of the photoresist that is thus initiated, the solubility thereof is reduced. Because those parts of the photoresist that are close to the surface are more strongly exposed, they are more strongly crosslinked and, hence, are more insoluble than the parts away from the surface. The change in the solubility is opposite to the change in solubility that is achieved in the first exposure step. While the exposed parts close to the surface have a higher solubility than the parts away from the surface as a result of the first exposure step, precisely the opposite gradient is produced by the second exposure step. Due to the selective solubility modification in the photoresist, increased developer selectivity in the aqueous developer is achieved, resulting in steeper resist profile sidewalls.

However, such an approach has a decisive disadvantage: the crosslinking reaction leads to the formation of a three-dimensional network polymer, particularly, in those parts of the photoresist that are close to the surface. The network polymer has altered development behavior compared with the original, linear layer-forming polymer, which leads to "rough", i.e., inexactly defined, e.g., frayed profile sidewalls. Such roughness complicates the subsequent process steps, such as, for example, the substrate etching.

SUMMARY OF THE INVENTION

It is accordingly an object of the invention to provide method for structuring a photoresist layer that overcomes the hereinafore-mentioned disadvantages of the heretofore-known devices and methods of this general type and that reduces or completely avoids the disadvantages described above. In particular, the present invention provides a method by which highly accurate transfer of the structure predetermined by the lithography mask to a photoresist layer is achieved.

DESCRIPTION OF THE PREFERRED EMBODIMENTS

With the foregoing and other objects in view, there is provided, in accordance with the invention, a process for structuring a photoresist layer including the steps of providing a substrate to which a photoresist layer is applied at least in some areas, the photoresist layer including a film-forming polymer containing molecular groups convertable into alkali-soluble groups by acid-catalyzed cleavage reactions, a photoacid generator releasing an acid on exposure to light in a first defined wavelength range, and a photobase generator releasing a base on exposure to light in a second defined wavelength range, exposing areas of the photoresist layer to a first light in the second defined wavelength range, the first light having a wavelength at which the photoacid generator is substantially inert to the irradiation, exposing areas of the photoresist layer to a second light in the first defined wavelength range, the second light having a wavelength at which the photobase generator is substantially inert to the irradiation, heating the photoresist layer to a temperature at which the acid-catalyzed cleavage reaction occurs, and developing the photoresist layer.

The wavelength ranges $\Delta\lambda_1$ and $\Delta\lambda_2$ can overlap in wide ranges. For the method according to the invention, it is merely necessary for there to be in each case at least one partial-range in the wavelength range $\Delta\lambda_1$ and in the wavelength range $\Delta\lambda_2$ that is not simultaneously also in the respective other wavelength range. Such a feature makes it possible to carry out a first exposure to light from the wavelength range $\Delta\lambda_2$ in which the photobase generator liberates a base but the photoacid generator is substantially inert to the radiation, i.e., does not liberate an acid. The reason for this lies in the fact that the exposure is carried out with light whose wavelength is in the wavelength range $\Delta\lambda_2$ but substantially not in the wavelength range $\Delta\lambda_1$. Conversely, light from the wavelength range $\Delta\lambda_1$ can be used in a second exposure step, with the result that the photoacid generator liberates an acid but the photobase generator is substantially inert to the radiation, i.e., does not liberate a base. The reason for this lies in the fact that the exposure is carried out with light whose wavelength is in the wavelength range $\Delta\lambda_1$ but substantially not in the wavelength range $\Delta\lambda_2$.

The expression "substantially" is intended to make clear that the chemical substances involved, i.e., photoacid generator and photobase generator, may have low absorptions also in the respective other wavelength range, or that, depending on the radiation source used for the irradiation, radiation of low intensity may also be released in the respective undesired wavelength range.

Within the scope of the present invention, the term "alkali-soluble groups" includes all groups that increase the solubility of the film-forming polymer in alkaline solutions. The term, therefore, covers, in particular, polar, functional groups, such as, for example, carboxyl, hydroxyl, and carboxamido groups, or groups that have these functional groups. Furthermore, the term is to be understood as meaning not only those groups that contribute to increased alkali solubility of the polymer but also those that additionally increase the transparency of the polymer—and, hence, of the photoresist layer—for light having very short wavelengths. This can be achieved by partly or completely fluorinating the groups. A suitable group is, for example, the 1,1,1,3,3,3-hexafluoro-2-hydroxyisopropyl group, by which the transparency of the polymer is increased at a wavelength of 157 nm.

Molecular groups that can be converted into alkali-soluble groups by acid-catalyzed cleavage reaction are to be understood as meaning acid-labile groups that have only low alkali solubility and eliminate a molecular fragment through the action of acids, if required with simultaneous thermal treatment, the alkali-soluble groups being liberated on or in the polymer. The term, thus, covers acid-labile protective groups as regularly used in positive resists. All conventional acid-labile protective groups may be used, such as, for example, ester groups, ether groups, cyclic or acyclic acetal groups, cyclic or acyclic ketal groups, silyl ether, or cyanohydrins. Examples of suitable protective groups are mentioned, for example, in U.S. Pat. No. 5,932,391 to Ushirogouchi et al. or U.S. Pat. No. 6,114,086 to Kobayashi et al., which are hereby incorporated by reference. The term "cleavage reaction catalyzed by the photolytically produced acid" is also to be understood in this context, i.e., as meaning that the cleavage reaction takes place under the action of the photolytically liberated acid.

In accordance with another mode of the invention, the molecular groups are selected from the group consisting of carboxylates, in particular, tert-alkyl esters, tetrahydrofuranyl esters, tetrahydropyranyl esters, alkylcyclohexyl esters, and adamantyl esters, ether groups, in particular, tert-alkyl ethers, tert-butyl ether, tetrahydrofuranyl ethers, and tetrahydropyranyl ethers, and butoxycarbonyloxy groups.

Molecular groups that are particularly preferred in such a context are ether groups selected from the group consisting of tert-alkyl ethers, in particular, tert-butyl ether, tetrahydrofuranyl ethers and/or tetrahydropyranyl ethers. The use of carboxylic esters selected from the group consisting of tert-alkyl carboxylates, in particular, tert-butyl carboxylate, tetrahydrofuranyl carboxylate, and/or tetrahydropyranyl carboxylate, is furthermore preferred.

Also preferred is the use of polymers that have molecular groups according to the following formula II:

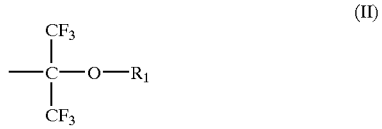

(II)

in which $R_1$ is selected from the group consisting of tert-alkyl groups, in particular, tert-butyl, tetrahydrofuranyl, tetrahydropyranyl, tert-butoxycarbonyloxy, or acetal groups.

In accordance with a further mode of the invention, the molecular groups in the polymer that are capable of undergoing the acid-catalyzed cleavage reactions are groups having the structure according to at least one of the following formulas III, IV, or V:

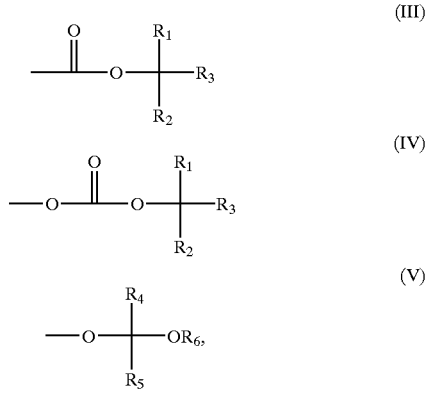

(III)

(IV)

(V)

in which $R_1$, $R_2$, and $R_3$, independently of one another, are selected from the group consisting of methyl, ethyl, propyl and butyl, and, preferably, $R_1$, $R_2$, and $R_3$ are methyl, and $R_4$, $R_5$, and $R_6$, independently of one another, are selected from the group consisting of hydrogen, methyl, ethyl, propyl, and butyl, with the condition that only $R_4$ or $R_5$ may be hydrogen and $R_6$ is not hydrogen.

In addition to the acid-labile groups, further groups that improve the lithographic properties or the etching resistance of the photoresist may be present in the polymer. In accordance with an added mode of the invention, the polymer additionally has further reactive groups, such as, for example, anhydride groups or succinic anhydride groups. These reactive groups permit a subsequent chemical treatment of the resist structures, such as, for example, chemical expansion of the mask by a silylation reaction. As a result of such a chemical aftertreatment, the critical dimension (CD) that can be achieved in the lithographic method can be further reduced.

The nature of the main chain of the film-forming polymer is of minor importance for the present invention. Thus, all polymer types regularly used in photoresists are suitable. For example, polymers having pure carbon main chains, which can be obtained, for example, by polymerization of unsaturated monomers, such as styrenes, acrylates, or methacrylates, are suitable.

Also suitable are polymers having hetero-atoms in the main chains, such as, for example, polysiloxanes, polyethers, or polyesters. The main chain may be composed partly or completely of fluorinated building blocks for improving the transparency of the polymer at low wavelengths.

In accordance with an additional mode of the invention, the polymer has an absorption maximum in a wavelength range between 150 and 450 nm.

To activate the photoacid generator, the photoresist layer is preferably exposed in the method according to the invention to light having a wavelength between 150 and 300 nm. Particularly fine structures can be produced in the photoresist layer by such DUV or VUV radiation (deep-ultraviolet or vacuum-ultraviolet). Alternatively, however, longer-wave light may also be used, for example having a wavelength of 300 to 450 nm, preferably, 350 to 450 nm (near-ultraviolet).

In principle, all compounds that are capable of liberating an acid on irradiation may be used as photoacid generators. In accordance with yet another mode of the invention, the photoacid generators are selected from the group consisting of onium compounds, in particular, diphenyliodonium triflate and trisulfonium nonasulfate, nitrobenzyl esters, in particular, 4-nitrobenzyl 9,10-dimethoxyanthracene-2-sulfonate, sulfones, in particular, phenylacyl phenyl sulfone, phosphates, in particular, triaryl phosphates, N-hydroxyimido-sulfonates, in particular, N-hydroxyphthalimidomethane sulfonate, and/or diazonaphthoquinones, in particular, 1-oxo-2-diazonaphthoquinone-5-arylsulfonate, are used. Further suitable photoacid generators are published in German Published, Non-Prosecuted Patent Application 19820477.9.

To activate the photobase generator, the photoresist layer is preferably exposed to light having a wavelength between 150 and 300 nm in the method according to the invention. Alternatively, however, longer-wave light may also be used, for example having a wavelength of 300 to 450 nm, preferably, 350 to 450 nm.

In accordance with yet a further mode of the invention, the photobase generator is selected from the group consisting of O-acyloximes, in particular, O-phenylacetyl-2-acetonaphthone oxime, benzoyloxycarbonyl derivatives, in particular, O-nitrobenzyl N-cyclohexylcarbamate, and nifedipines, in particular, N-methylnifedipines. Other conventional photobase generators can, however, also be used. Further examples of suitable photobase generators are listed, for example, the U.S. Pat. No. 5,650,261 to Winkle, which is hereby incorporated by reference.

As already described, photoacid generators are used together with photobase generators in the method according to the invention, the photoacid generator liberating an acid on exposure to light from a defined wavelength range $\Delta\lambda_1$ and the photobase generator liberating a base on exposure to light from a defined wavelength range $\Delta\lambda_2$. The photoacid generator and the photobase generator must now be tailored to one another so that, on exposure to light from the wavelength range $\Delta\lambda_1$, the photoacid generator liberates the acid but the photobase generator is substantially inert to the irradiation, i.e., does not liberate a base, and, conversely, on exposure to light from the wavelength range $\Delta\lambda_2$, the photobase generator liberates the base but the photoacid generator is substantially inert to the irradiation, i.e., does not liberate an acid. The discovery of such combinations of a photoacid generator and a photobase generator that are tailored to one another presents no difficulty for a person skilled in the art because the decomposition characteristics of the compounds as a function of the wavelength of the incident light are available.

In accordance with yet an added mode of the invention, the photoresist layer is applied to the substrate by applying a solution including a solvent, the film-forming polymer, the photoacid generator, and the photobase generator to the substrate and then at least partly evaporating the solvent. In accordance with yet an additional mode of the invention, the photoresist layer is applied to the substrate by spin-coating. The solvent used may be all conventional photoresist solvents or mixtures thereof that are capable of taking up the resist components to form a clear, particle-free, and storage-stable solution and ensuring a good layer quality when the substrate is coated. Solvents selected from the group consisting of methoxypropyl acetate, 1-methoxy-2-propyl acetate, cyclopentanone, cyclohexanone, γ-butyrolactone, ethyl lactate, or mixtures of at least two of these solvents are particularly preferred for the method according to the invention. 1-Methoxy-2-propyl acetate is a particularly preferred solvent.

The solvent is preferably evaporated at temperatures between 60 and 160° C. In such a "prebake" step, the solvent is preferably completely expelled from the photoresist.

In accordance with again another mode of the invention, solutions that include 1 to 50% by weight, preferably, 3 to 20% by weight, of film-forming polymer, 0.01 to 10% by weight, preferably, 0.1 to 1% by weight, of photoacid generator, 0.01 to 10% by weight, preferably, 0.1 to 1% by weight, of photobase generator, and 50 to 99% by weight, preferably, 88 to 96% by weight, of solvent are used for applying the photoresist layer to the substrate. The sum of all components present in the solution is 100% by weight in each case.

The solution may contain, as further components, additives by which an improvement in the storage stability, in the pot life behavior, in the film formation, in the resolution, in the radiation sensitivity or in other product- or process-improving properties can regularly be achieved in photoresist layers or solutions thereof.

In the method according to the invention, the photoresist layer is first exposed in parts to light from the defined wavelength range $\Delta\lambda_2$, the wavelength of the light being chosen so that the photoacid generator is substantially inert to the irradiation. Because those parts of the photoresist that are close to the surface are more strongly exposed, a higher concentration of liberated base is achieved in these parts.

It is, therefore, decisive for the method according to the invention that the photoresist layer be exposed to light from the wavelength range $\Delta\lambda_1$ before the development and before the additional heating step in which the photolytically produced acid initiates the cleavage reaction. As a result of the irradiation without a photomask, the acid is liberated from the photoacid generator. Because, due to the resultant light intensity profile, once again, the parts close to the surface are more strongly exposed than the parts away from the surface during such exposure, a higher concentration of acid is liberated in the parts close to the surface than in the parts away from the surface.

As a result of such selective neutralization reaction, the latent image in the still undeveloped photoresist layer is improved for positive resists, i.e., the distribution of the photochemically produced acid along the exposure edges becomes steeper. Consequently, after development, firstly a substantial steepening of the resist profiles is achieved and secondly the "roughness" of the resist sidewalls, as observed after the development in the case of the additional crosslinking of those parts of negative resists that are close to the surface, is avoided.

Of course, the neutralization reaction must not go to completion because, in such a case, no acid would be available for the subsequent cleavage reaction. In every case, an excess of acid must, therefore, be present. To comply with such a condition, the concentrations of photoacid generator and photobase generator in the photoresist layer, the respective exposure intensity during exposure to light from the wavelength range $\Delta\lambda_1$ or from the wavelength range $\Delta\lambda_2$, and/or the quantum yield with which the decomposition of photoacid generator or photobase generator is effected can be tailored to one another.

In accordance with again a further mode of the invention, the photo resist layer is subjected, after the two exposure steps, to a heating step in which the photoresist layer is heated to a temperature at which the cleavage reaction catalyzed by the photolytically produced acid takes place. Preferably, the photoresist layer is heated to a temperature between 80 and 250° C. In the heating step, the acid liberated can react with the acid-labile molecular groups in the film-forming polymer and, thus, liberate the alkali-soluble groups on the polymer. As a result, the solubility of the polymer in alkaline solutions increases.

Alkaline solutions are preferably used for developing the exposed photoresist layer. The preferably used solvent here is water. In accordance with again an added mode of the invention, a solution of 2.38% by weight of tetramethylammonium hydroxide in water is used as the developer solution.

In accordance with again an additional mode of the invention, the photoresist layer additionally includes a thermoacid generator that liberates an acid when the temperature is increased. In this case, the photoresist layer is heated to a temperature at which the thermoacid generator liberates an acid and the acid-catalyzed cleavage reaction takes place.

It is particularly advantageous in such a case to apply the photoresist layer to the substrate by a procedure in which a solution includes a solvent, the film-forming polymer, the photoacid generator, the photobase generator, and the thermoacid generator is applied to the substrate and the solvent is then at least partly evaporated. In accordance with a concomitant mode of the invention, the photoresist layer is applied to the substrate by spin-coating.

In this embodiment of the present invention, too, all conventional photoresist solvents or mixtures thereof that are capable of taking up the resist components to give a clear, particle-free, and storage-stable solution and ensuring good layer quality on exposure of the substrate can be used as a solvent. Solvents selected from the group consisting of methoxypropyl acetate, cyclopentanone, cyclohexanone, γ-butyrolactone, ethyl lactate, or mixtures of at least two of these solvents are particularly preferred. 1-Methoxy-2-propyl acetate is a particularly preferred solvent.

In advantageous variants of the embodiment employing a thermoacid generator, solutions that include 1 to 50% by weight, preferably, 3 to 20% by weight, of film-forming polymer, 0.01 to 10% by weight, preferably, 0.1 to 1% by weight, of photoacid generator, 0.01 to 10% by weight, preferably, 0.1 to 1% by weight, of photobase generator, 0.01 to 10% by weight, preferably, 0.1 to 1% by weight, of thermoacid generator, and 50 to 99% by weight, preferably, 88 to 96% by weight, of solvent are used for applying the photoresist layer to the substrate. The sum of all components present in the solution is likewise 100% by weight in each case.

All solid and liquid compounds that are soluble in the resist solvent, capable of liberating an acid and photochemically inert with respect to the exposure for structuring, can be used as the thermoacid generator.

Particularly preferred thermoacid generators are those selected from the group consisting of thiolanium salts, in particular, benzylthiolanium hexafluoro-propane-sulfonate, or nitrobenzyl esters, in particular, 2-nitrobenzyl tosylate.

For activating the thermoacid generator, the photoresist layer is preferably heated to a temperature between 80 and 250° C. in the method according to the invention.

The photoresist layer is applied by spin-coating to the substrate to be structured and is dried in a subsequent heating step (between 60 and 160° C.) in which the solvent can evaporate. A latent image is then produced in the resulting solid photoresist layer by exposing the photoresist layer to light having a defined wavelength. The exposure for structuring is effected at a wavelength of 248 nm through a lithography mask.

As a result of such exposure, the base is liberated from the photobase generator. Due to the absorption-related reduction of the light intensity within the photoresist layer, the undesired base distribution within the resist layer occurs, i.e., the concentration of the base decreases continuously with increasing distance from the surface of the photoresist layer.

This is followed by exposure to light of wavelength 365 nm without a photomask. As a result of such exposure, the acid is liberated from the photoacid generator. Due to the absorption-related reduction in the light intensity within the photoresist layer, a gradient of the acid distribution within the resist layer occurs, i.e., the concentration of the acid decreases continuously with increasing distance from the surface of the photoresist layer. This results in greater (but not complete) neutralization superficially in the resist than in parts away from the surface.

In the subsequent heating step (the "post-exposure bake" (PEB), the temperature of which is above that of the first heating step (80 to 250° C.)), on one hand, the functional protective groups in the film-forming polymer are cleaved by the acid produced during the floodlight exposure and, on the other hand, the acid is neutralized by the base.

If a thermoacid generator is additionally present in the photoresist, an acid is additionally generated thermally in the heating step. The degree of neutralization is thus additionally adjusted.

Of course, in this case, too, the neutralization reaction must not take place completely because no acid would then be available for the subsequent cleavage reaction. An excess of acid must, therefore, be present. To comply with such a condition, the concentrations of the photoacid generator, photobase generator, and thermoacid generator in the photoresist layer, the respective exposure intensity during exposure to light from the wavelength range $\Delta\lambda_1$ or from the wavelength range $\Delta\lambda_2$, and/or the quantum yield with which the decomposition of photoacid generator or photobase generator takes place can be tailored to one another.

In the parts exposed during the exposure for structuring, the resist becomes insoluble in the alkaline developer, independently of the presence of a thermoacid generator. The photoresist layer is then treated, for example, with a 2.38% strength by weight aqueous tetramethylammonium hydroxide solution, with the result that the unexposed parts of the photoresist layer are dissolved and are removed. A negative relief pattern is, thus, produced in the photoresist layer, i.e., the unexposed parts of the photoresist mask are removed, while the exposed parts remain behind and can serve as a protective mask in a subsequent structuring step.

Other features that are considered as characteristic for the invention are set forth in the appended claims.

Although the invention is described herein as embodied in a method for structuring a photoresist layer, it is, nevertheless, not intended to be limited to the details described because various modifications and structural changes may be made therein without departing from the spirit of the invention and within the scope and range of equivalents of the claims.

The construction and method of operation of the invention, however, together with additional objects and advantages thereof, will be best understood from the description of the specific embodiments.

We claim:

1. A process for structuring a photoresist layer, which comprises:
    a) providing a substrate to which a photoresist layer is applied at least in some areas, the photoresist layer including:
        a film-forming polymer containing molecular groups convertible into alkali-soluble groups by acid-catalyzed cleavage reactions;
        a photoacid generator releasing an acid on exposure to light in a first defined wavelength range ($\Delta\lambda_1$); and
        a photobase generator releasing a bass on exposure to light in a second defined wavelength range ($\Delta\lambda_2$);
    b) exposing areas of the photoresist layer to a first light in the second defined wavelength range ($\Delta\lambda_2$), the first light having a wavelength at which the photoacid generator is substantially inert;
    c) exposing areas of the photoresiat layer to a second light in the first defined wavelength range ($\Delta\lambda_1$) the second light having a wavelength at which the photobase generator is substantially inert;
    d) heating the photoresist layer to a temperature at which the acid-catalyzed cleavage reaction occurs; and
    e) developing the photoresist layer with an alkaline solution.

2. The process according to claim 1, which further comprises carrying out the photoresist layer heating step by heating the photoresist layer to a temperature between 80 and 250° C.

3. The process according to claim 1, wherein the first defined wavelength range is between 150 and 450 nm and which further comprises carrying out the exposing step by exposing the photoresist layer to UV light having a wavelength between 150 and 450 nm to release acid from the photoacid generator.

4. The method according to claim 3, which further comprises carrying out the exposing step by exposing the photoresist layer to UV light having a wavelength between 300 and 450 nm to release acid from the photoacid generator.

5. The method according to claim 4, which further comprises carrying out the exposing step by exposing the photoresist layer to UV light having a wavelength between 350 and 450 nm to release acid from the photoacid generator.

6. The method according to claim 1, wherein the first defined wavelength range is between 300 and 450 nm and which further comprises carrying out the exposing step by exposing the photoresist layer to UV light having a wavelength between 300 and 450 nm to release acid from the photoacid generator.

7. The method according to claim 1, wherein the first defined wavelength range is between 350 and 450 nm and which further comprises carrying out the exposing step by exposing the photoresist layer to UV light having a wavelength between 350 and 450 nm to release acid from the photoacid generator.

8. The method according to claim 1, wherein the second defined wavelength range is between 150 and 450 nm and which further comprises carrying out the exposing step by exposing the photoresist layer to UV light having a wavelength between 150 and 450 nm to release base from the photobase generator.

9. The method according to claim 8, which further comprises carrying out the exposing step by exposing the photoresist layer to UV light having a wavelength between 300 and 450 nm to release base from the photobase generator.

10. The method according to claim 9, which further comprises carrying out the exposing step by exposing the photoresist layer to UV light having a wavelength between 350 and 450 nm to release base from the photobase generator.

11. The method according to claim 1, wherein second the defined wavelength range is between 300 and 450 nm and which further comprises carrying out the exposing step by exposing the photoresist layer to UV light having a wavelength between 300 and 450 nm to release base from the photobase generator.

12. The method according to claim 1, wherein the second defined wavelength range is between 350 and 450 fin and which further comprises carrying out the exposing step by exposing the photoresist layer to UV light having a wavelength between 350 and 450 nm to release base from the photobase generator.

13. The method according to claim 1, wherein the polymer has an absorption maximum in a wavelength range between 150 and 450 nm.

14. The process according to claim 1, wherein the photoacid generator is selected from the group consisting of onium compounds, nitrobenzyl esters, sulfones, phosphates, N-hydroxyimidosulfonates, and diazonaphthoquinones.

15. The process according to claim 14, wherein the onium compounds are selected from the group consisting of diphenyliodonium triflate and trisulfonium nonasulfate.

16. The process according to claim 14, wherein the nitrobenzyl ester is 4-nitrobenzyl 9,10-dimethoxyanthracene-2-sulfonate.

17. The process according to claim 14, wherein the sulfone is phenylacyl phenyl sulfone.

18. The process according to claim 14, wherein the phosphates are triaryl phosphates.

19. The process according to claim 14, wherein the N-hydroxyimidosulfonate is N-hydroxyphthalimidomethane sulfonate.

20. The process according to claim 14, wherein the diazonaphthoquinone is 1-oxo-2-diazonaphthoquinone5-arylsulfonate.

21. The process according to claim 1, wherein the photobase generator is selected from the group consisting of O-acyloximes, benzoyloxycarbonyl derivatives, and nifedipines.

22. The process according to claim 21, wherein the O-acyloxime is O-phenylacetyl-2-acetonaphthone oxime.

23. The process according to claim 21, wherein the benzoyloxycarbonyl derivative is O-nitrobenzyl N-cyclohexylcarbamate.

24. The process according to claim 21, wherein the nifedipines are N-methylnifedipines.

25. The process according to claim 1, wherein the molecular groups are selected from the group consisting of carboxylates, ether groups, cyclic ketals, acyclic ketals, cyclic acetals, acyclic acetals, and butoxycarbonyloxy groups.

26. The process according to claim 25, wherein the carboxylates are selected from the group consisting of tert-alkyl esters, tetrahydrofuranyl esters, tetrahydropyranyl esters, alkylcyclohexyl esters, and adamantyl esters.

27. The process according to claim 25, wherein the ether groups are selected from the group consisting of tert-alkyl ethers, tert-butyl ethers, tetrahydrofuranyl ethers, and tetrahydropyranyl ethers.

28. The process according to claim 1, wherein the film-forming polymer includes one of anhydride structures and succinic anhydride structures.

29. The process according to claim 1, which further comprises applying the photoresist layer to the substrate by:
    applying a solution having a solvent, the film-forming polymer, the photoacid generator, and the photobase generator; and
    then evaporating at least some of the solvent.

30. The process according to claim 29, wherein the solvent is selected from the group consisting of 1-methoxy-2-propyl acetate, cyclopentanone, cyclohexanone, γ-butyrolactone, ethyl lactate, and mixtures of at least two of 1-methoxy-2-propyl acetate, cyclopentanone, cyclohexanone, γ-butyrolactone, ethyl lactate.

31. The process according to claim 29, which further comprises evaporating the solvent at a temperature between 60 and 160° C.

32. The process according to claim 29, wherein the solution includes:
    from 1 to 50% by weight of the film-forming polymer;
    from 0.01 to 10% by weight of the photoacid generator;
    from 0.01 to 10% by weight of the photobase generator; and
    from 50 to 99% by weight of the solvent.

33. The process according to claim 32, wherein the solution contains from 3 to 20% by weight of the film-forming polymer.

34. The process according to claim 32, wherein the solution contains from 0.1 to 1% by weight of the photoacid generator.

35. The process according to claim 32, wherein the solution contains from 0.1 to 1% by weight of the photobase generator.

36. The process according to claim 32, wherein the solution contains from 88 to 96% by weight of the solvent.

37. The process according to claim 1, which further comprises carrying out the developing step with a solution of 2.38% by weight of tetramethylammonium hydroxide in water.

38. The process according to claim 1, wherein the photoresist layer includes a thermoacid generator releasing an acid when a temperature of the thermoacid generator is raised above a given temperature, and which further comprises beating the photoresist layer to a temperature at which the thermoacid generator releases the acid and at which the acid-catalyzed cleavage reaction occurs.

39. The process according to claim 38, wherein the thermoacid generator is selected from the group consisting of thiolanium salts and nitrobenzyl esters.

40. The process according to claim 39, wherein the thiolanium salt is benzylthiolanium hexafluoropropanesulfonate.

41. The process according to claim 39, wherein the nitrobenzyl esters is 2-nitrobenzyl tosylate.

42. The process according to claim 38, which further comprises applying the photoresist layer to the substrate by:
    applying a solution having a solvent, the film-forming polymer, the photoacid generator, the photobase generator, and the thermoacid generator to the substrate; and
    then evaporating at least some of the solvent.

43. The process according to claim 42, wherein the solution includes:
    from 1 to 50% by weight of the film-forming polymer;
    from 0.01 to 10% by weight of the photoacid generator;
    from 0.01 to 10% by weight of the photobase generator;
    from 0.01 to 10% by weight of the thermoacid generator; and
    from 50 to 99% by weight of the solvent.

44. The process according to claim 43, wherein the solution contains from 3 to 20% by weight of the film-forming polymer.

45. The process according to claim 43, wherein the solution contains from 0.1 to 1% by weight of the photoacid generator.

46. The process according to claim 43, wherein the solution contains from 0.1 to 1% by weight of the photobase generator.

47. The process according to claim 43, wherein the solution contains from 0.1 to 1% by weight of the thermoacid generator.

48. The process according to claim 43, wherein the solution contains from 88 to 96% by weight of the solvent.

49. A process for structuring a photoresist layer, which comprises:
    a) providing a substrate to which a photoresist layer is applied at least in some areas, the photoresist layer including:
        a film-forming polymer containing molecular groups convertible into alkali-soluble groups by acid-catalyzed cleavage reactions;
        a photoacid generator releasing an acid on exposure to light in a first defined wavelength range ($\Delta\lambda_1$); and
        a photobase generator releasing a base on exposure to light in a second defined wavelength range ($\Delta\lambda_2$);
    b) exposing areas of the photoresist layer to a first light in the second defined wavelength range ($\Delta\lambda_2$), the first light having a wavelength at which the photoacid generator is substantially inert;
    c) exposing areas of the photoresist layer to a second light in the first defined wavelength range ($\Delta\lambda_1$), the second light having a wavelength at which the photobase generator is substantially inert;
    d) heating the photoresist layer to a temperature at which the acid-catalyzed cleavage reaction occurs;
    e) developing the photoresist layer; and
    selecting the molecular groups to be one of:
        groups having a structure according to the formula:

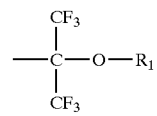

where $R_1$ is selected from the group consisting of tert-alkyl groups, tert-butyl, tetrahydrofuranyl, tetrahydropyranyl, tert-butoxycarbonyloxy, and acetal groups; and
    groups having a structure according to at least one of the formulas:

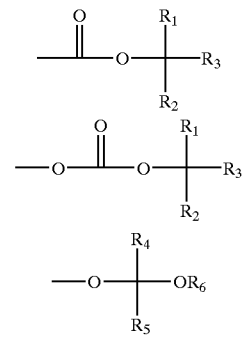

where:
        $R_1$, $R_2$, and $R_3$, independently of one another, are selected from the group consisting of methyl, ethyl, propyl, and butyl;
        $R_4$, $R_5$, and $R_6$, independently of one another, are selected from the group consisting of hydrogen, methyl, ethyl, propyl, and butyl;
        only one of $R_4$ and $R_5$ is hydrogen; and
        $R_6$ is not hydrogen.

50. The method according to claim 49, wherein $R_1$, $R_2$, and $R_3$ are methyl.

* * * * *